United States Patent

Wu et al.

[11] Patent Number: 5,156,004
[45] Date of Patent: Oct. 20, 1992

[54] COMPOSITE SEMICONDUCTIVE THERMOELECTRIC REFRIGERATING DEVICE

[75] Inventors: Hong-ping Wu; Ying-Ru Wang, both of 7 Wei Ying Yu Tong Xuan Wu Men, Beijing, China

[73] Assignees: Hong-Ping Wu; Ying-Ru Wang, both of Bejing, China; Michael Ferris, Montreal, Canada; Shao-Hong Wan; Xiao Q. Chen, both of Bejing, China

[21] Appl. No.: 603,995

[22] Filed: Oct. 24, 1990

[30] Foreign Application Priority Data

Oct. 27, 1989 [CN] China ................... 89 1 08041

[51] Int. Cl.$^5$ .............................................. H01V 1/30
[52] U.S. Cl. ........................................ 62/3.1; 62/3.2; 357/87; 136/203; 136/225
[58] Field of Search .................. 62/3.1, 3.3, 3.7, 3.62, 62/3.2; 357/87; 136/212, 225, 203

[56] References Cited

U.S. PATENT DOCUMENTS

| | | | |
|---|---|---|---|
| 2,656,158 | 10/1953 | Hodson et al. | 257/245 |
| 3,074,242 | 1/1963 | Lindenblad | 62/3.3 |
| 3,077,080 | 2/1963 | Pietsch | 62/3.3 |
| 3,500,650 | 3/1970 | Mole et al. | 62/3 |
| 3,607,444 | 9/1971 | DeBucs | 136/212 |
| 3,648,470 | 3/1972 | Schultz | 62/3 |
| 4,483,341 | 11/1984 | Witteles | 62/3.2 |
| 4,734,139 | 3/1988 | Shakun et al. | 136/210 |
| 4,859,250 | 8/1989 | Buist | 62/3.3 |
| 4,891,949 | 1/1990 | Caldarola | 62/3.2 |

FOREIGN PATENT DOCUMENTS

| | | | |
|---|---|---|---|
| 1295040 | 5/1969 | Fed. Rep. of Germany | 357/87 |
| 88062226 | 7/1987 | Japan . | |

Primary Examiner—Albert J. Makay
Assistant Examiner—William C. Doerrler
Attorney, Agent, or Firm—Collard, Roe & Galgano

[57] ABSTRACT

A composite semiconductive thermoelectric refrigerating module comprises dozens or hundreds composite P-N couples which are electrically connected in series to form an array of required configuration which is fixed with electrical and thermal insulator and combined with the heat absorber and a thermal radiator, respectively, by thermoconductive greased films of electrical insulation. The refrigerating device is characterized by a good conductor sandwiched between the semiconductor head parts of a thermoelectric element by surface-to-surface brazing. This device can be substituted for small sized vapor compression refrigerating devices. The first embodiment of the invention is of circular configuration, while the second embodiment is rectangular. Other embodiments of specific configurations in accordance with requirements can also be constructed.

32 Claims, 2 Drawing Sheets

COMPOSITE SEMICONDUCTIVE THERMOELECTRIC REFRIGERATING DEVICE

BACKGROUND OF THE INVENTION

1. Field of the Invention

The present invention relates to a thermoelectric refrigerating device consisting of composite elements of semiconductors and good conductive material as its heat sink.

2. The Prior Art

At present, all types of high performance domestic refrigerators in the world use compressors (vapor compression systems) working with a refrigerant as heat sinks. Because the unavoidable leakage of the refrigerant, freon, during its manufacture and utilization is badly damaging to the protective ozone layer in the atmosphere, the use of freon has been a cause for great concern in many countries. Replacement of vapor compression refrigerators and thereby the elimination of the use of the refrigerant, freon, has become an important technological problem to be solved in the refrigeration industry.

Until now, thermoelectric refrigeration has not been so developed to be widely applicable in common refrigerators. The major reason for this is that the current P and N elements, which compose a thermocouple, are made only by two single semiconductive materials. Because they are limited by the thermoelectric and processing characters of semiconductive materials, the single element of semiconductive materials cannot be finely composed. Consequently, a reasonable structure conforming to the requirements of practical temperature distribution, cannot be formed of the thermoelectric device consisting of said thermocouples, which are composed of P and N elements. The explanation is as follows:

(1) The heat transfer capacity of the electron flow in semiconductor elements (main component is bismuth telluride), for a given semiconductor material, is such that the heat transfer capacity increases with the cross-section area of P-N couple elements;

(2) The heat transfer speed of the electron flow in P-N couple elements is such that the heat transfer speed decreases with increasing length of the elements;

(3) The temperature difference between the hot and cold end surfaces of P-N couple elements is such that the temperature difference increases in relation to the length of the elements in their heat transfer direction;

(4) The distribution of the heat flow density of a thermoelectric device consists of a multiplicity of dozens or hundreds of P-N couples, such that the distribution of heat flow density in P-N couples depends on the distances between P and N type elements, between P-N couples and between the hot and cold end surfaces of the P and N type elements. In general, the better the conditions for the aforementioned distances are satisfied, the more reasonable the distribution of heat flow density will be; and (5) The heat rejection rate of the thermal radiator is designed according to the distribution of heat flow density at the hot end of the refrigerating device.

All of the five aforementioned factors relate to one another. When the end area of a thermoelectric element is enlarged to optimize Factor 1 while maintaining the distances between P and N elements and between P-N couples for the multiplicity of dozens or hundreds of P-N couples, the end surface area of the thermoelectric module will be large, and also the distance between the end surfaces of cold and hot will be increased for good insulation; otherwise, the serious heat exchanging will occur inside the thermoelectric module, due to the enlargement of the two ends of the surface area and the temperature difference, which will also be affected. For this reason, the increase of factor 3 must have a big distance interval of insulation and more difference in temperature. But, it is limited by factor 2 if the single semiconductor material will be used to increase the distance interval. Meanwhile, it is also limited by the fragility and processing difficulty of semiconductive material; as a result, factor 4 is only an ideal model and cannot be practiced. In fact, the distance between hot and cold ends can only be several millimeters in length if the single semiconductive material is used. Thus, it is preferable to use a small distance interval and vacuum insulation or insulation in firmament, and it is extremely unfavorable to use this in common refrigerators.

As a result of the mutual restrictions among Factors 1 to 4, a compromise has to be made. No optimized construction of broad applicability for a thermoelectric module was every found. When direct current flows in a thermoelectric module, the distribution of heat flow density is not reasonable. The temperature difference between cold and hot end surfaces is not large, and there exists considerable heat exchange inside the module. In addition, the air-cooled thermal radiators adopted, at present, are unable to adapt to the distribution of heat flow density at the surface of a thermoelectric module, nor can they meet the required rate of heat rejection. They can only satisfy one of the two aspects, at the expense of the other, consequently aggravating the restrictions of Factors 1 to 4.

The final results are as follows: The practical temperature difference of a thermoelectric module is far below the theoretical maximum value. The cooling efficiency is considered decreased to far below the theoretical value (80 percent). The maximum efficiency achievable on a thermoelectric module, at present, is very low, in comparison to that of vapor compression refrigerators. In addition, the efficiency of a thermoelectric module is dependent upon ambient temperatures. When the ambient temperature is over 25° C., a thermoelectric module will lose almost all its cooling capacity and waste electric energy. If circulating water is applied as coolant for a thermoelectric module, a water supply is required. This not only wastes water, but it also makes it difficult to design and manufacture mobile and portable self-supporting units.

Due to all the aforementioned reasons, state of the art technology in semiconductive thermoelectric refrigeration is still not comparable to that of vapor compression refrigeration and, therefore, has not found broad application in the refrigeration industry.

SUMMARY OF THE INVENTION

It is an object of the present invention to provide a new type of P and N element which is called the composite semiconductive thermoelectric element. This element is formed by a semiconductor and a good conductor. It is easy to be composed and optimized and consists of a composite thermo-couple which will be used to form a composite semiconductive thermoelectric module and then to make a composite semiconductive thermoelectric device.

This object is achieved according to the present invention by employing an integralized air-cooled thermal radiator made of metal and can realize coordinated improvements of the aforementioned five factors over the ambient temperature range of from 10° C. to 35° C. The self-electric resistance of composite semiconductive material will be used as a feedback signal for the automatic control and an efficiency of performance close to maximum theoretical value can be achieved. Refrigerators using the thermoelectric refrigerating device can attain the benefits of conserving electric energy and are ideal substitutes for vapor compression refrigerators.

According to the invention, a composite semiconductor thermoelectric element for use in a thermoelectric module assembly for transferring heat between a hot and a cold junction comprises two semiconductor layers of like type, each layer having inner and outer surfaces and having interposed between the inner surfaces a good thermoconductive and electroconductive member (or slate). The member is joined to the two semiconductor layers by surface to surface brazing, the outer surfaces each to be connected to an electrical conductor.

The invention also provides a thermoelectric refrigerating module assembly comprising a plurality of composite semiconductor thermoelectric elements connected in series electrically and in parallel thermally for transferring heat between a hot and a cold junction. The composite elements each comprise two semiconductor layers of like type, each having inner and outer surfaces, and having interposed between the inner surfaces a good thermoconductive and electroconductive member (or slate). The member is joined to the two semiconductor layers by surface to surface brazing, and the outer surfaces each are brazed to strips of an electrical conductor, the strips being connected electrically in series.

Preferably, the greased film is evenly greased on both sides of the film, and is provided with evenly distributed openings filled up with the grease.

Furthermore, according to the invention, a thermoelectric refrigerating module assembly comprises a plurality of semiconductor thermoelectric elements connected in series electrically and in a parallel thermally for transferring heat between a hot and a cold junction, the outer surfaces of each element being connected to an electrical conductor, the conductors being connected electrically in series, and a flexible thermoconductive electrical insulating greased film having two sides, the film to be interposed between the strips and a respective one of the junctions, the greased film being greased on at least one side with a thermoconductive grease.

The following preferred features are made possible by the invention:

(1) P and N type elements consisting of composite materials are used. A good conductive bar is interposed between two semiconductive materials by surface to surface brazing, that means a P type semiconductor +good conductive bar +P type semiconductor to form a composite semiconductive thermoelectric element which is one P type element of composite thermocouple, also the same for N type element. As the result of composite, the condition of optimizing for the structure will be created for meeting the requirement of factors 1 to 4. On the other hand, it is easy to be processed and formed, i.e., to select the appropriate section area of the junction of an element based on the heat quantity to be loaded. The thickness of the semiconductor is selected based upon the flowing speed of loading heat and the size of the temperature difference; to select the length of good conductor based upon insulated distances between the two ends of cold and hot. In addition, the reasonable proportion of thickness in the semiconductor and the good conductive bar should also be selected. Consequently, the reasonable insulated distance between elements, thermocouples and cold end and hot end will be realized. The reasonable design could be made based upon the requirements of practical distribution of temperature and cooling needed, due to the appearance of the composite semiconductive thermoelectric element and composite semiconductive thermoelectric device consisting of the elements.

(2) The composite semiconductive thermoelectric element has a special structure of a good conductive bar interposed between two layers of P type or N type. It forms an obvious difference from single semiconductive element of current. Each composite semiconductive thermoelectric element has four junctions. Two junctions are formed by two end surfaces brazed on flat copper strips, and the other two transitional junctions are formed by a good conductive bar interposed between the layers P or N. The current single semiconductive element has only two junctions. Four thermoelectric effects will occur in the composite semiconductive thermoelectric element when the current passed through it. The function of thermoelectric effect occurring in the junction of end surface is different from the transitional junction. The functions of thermoelectric effect occurring in the junctions of end surfaces are absorption of heat from the object to be cooled and exhausting heat to the outside, respectively. The heat and cold obtained from the thermoelectric effect which takes place in the transitional junctions will not jointly exchange directly with the outside because they are enclosed by the adiabatic materials. The heat conducts and contains inside of the good conductor and then forms a "steady temperature stratum" which functions as good insulation. The temperature of the steady temperature stratum is always kept higher than the cold end and lower than the hot end, so the best working condition will be created for the semiconductor in the cold end. The other function of "steady temperature stratum" is "directional transferring." More simply stated, the two functions of the conductive bar are called "heat capacitor and heat transferring." As a result, the cooling capacity will be greatly increased, while the temperature difference will remain constant. It has never appeared to tier up the basic semiconductive element in the structure of a single semiconductor thermoelectric module. Usually, the "module" is arranged in tiers. There are insulators between the modules. This is called "multistage structure" or "multistage cooling" or "thermopile." It does not have the function of "heat capacitor, heat transferring" since the layer between the module is an insulator, rather than being a good conductor. The structure can only increase the temperature difference, but decreases the cooling capacity. The composite semiconductive thermoelectric module could be called a "graded stage structure" compared to the concept of current "multistage structure." These two concepts have an essential difference.

(3) When the composite semiconductive thermocouples of dozens or hundreds are connected in series of a given arrangement, and a reasonable adiabatic distances are made between elements, couples and end surfaces of cold and hot are isolated from ambient air by thermal and electrical insulating materials, forming a composite semiconductive module hermetically and thermally sealed from the atmosphere. It is impossible to realize the inside adiabat to use the adiabatic materials, since there is only a several millimeter distance between the elements, couples and end surface of cold and hot in the current single semiconductive thermoelectric module.

A composite semiconductive thermoelectric module with said characteristics 1, 2 and 3 has sufficient temperature differences established between its hot and cold end surfaces. No heat exchange can take place on the rest of the surfaces. Heat is pumped in a designated direction at a sufficient flow density and speed, such that the distribution of heat flow density is most equitable. In addition, the composite semiconductive thermoelectric module can be constructed into different configurations. It can be easily assembled to obtain a perfect connection of its hot and cold end surfaces with a thermal radiator and a heat absorber, respectively, under different pressures.

(4) The electric resistance value of semiconductive material will be accumulated when the thermocouples were connected in series. A certain sum of thermocouples makes a certain electric resistance value, under the conditions of a definite semiconductive material, a definite environmental temperature of measuring, and the temperature difference does not exist between the end surface of cold and hot. The temperature difference will emerge in the end surfaces of cold and hot when the direct current is passed through. Based on this theory, the electric resistance value will be changed according to the changing of temperature difference. This changing electric resistance value could be used as a feedback signal to automatic control device. But, in the prior art, there is not anyone to apply and to use this application of thermoelectric effect. The reason is that the single semiconductive thermoelectric module is interfered with by disorderly inside temperature distribution and without any capability of resisting this interference when the module is working. The electric resistance value cannot be used for changing speed because it is too quick and unstable. It is an adiabatic system, except for the two end surfaces of cold and hot. Inside of a composite semiconductive thermoelectric, the heat direction is the single direction. The changing speed of electric resistance value caused by temperature changing will be buffered by the structure of "steady temperature stratum" and reached stable level which can be used as a feedback signal to realize the automatic control.

(5) The base plate for the radiator is made of copper (2 mm to 4 mm thick) according to the configuration of the hot end surface of the composite semiconductive thermoelectric module. The radiator base plate may be integrally made into the required shape, or may be composed of several segments assembled into the required shape. The fins are made of copper sheets which are 0.1 mm to 0.5 mm thick. The fins have bent edges, they are longer than the radiator base plate, and they are brazed onto the surface of the base plate with the aid of a fixture, forming an air-cooled metallic radiator. The number of fins on the base plate and their included angle and spacing are determined by heat flow density and speed at the hot end surface of said composite semiconductive thermoelectric module. If they are radially arranged, the included angle may be from 1 to 5 degrees. If they are arranged in parallel, the spacing may be from 1 mm to 4 mm. Space for a clamping bar for securing the thermal radiator to other parts is left between every 10 to 20 fins. Depending upon its selected structure, the radiator can be of an integral form or of an assembled construction.

BRIEF DESCRIPTION OF THE DRAWINGS

Other objects and features of the present invention will become apparent from the following detailed description considered in connection with the accompanying drawings, which disclose several embodiments of the present invention. It should be understood, however, that the drawings are designed for the purpose of illustration only and not as a definition of the limits of the invention.

In the drawings, wherein similar reference characters denote similar elements throughout the several views.

DETAILED DESCRIPTION OF THE PREFERRED EMBODIMENTS

Figure 1:
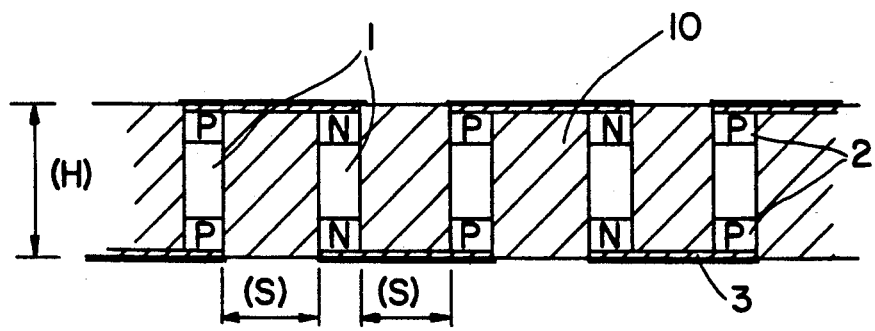
FIG. 1 shows a schematic sectional drawing of a fraction of the connection between composite semiconductor P and N elements and between P and N couples.
Figure 2:
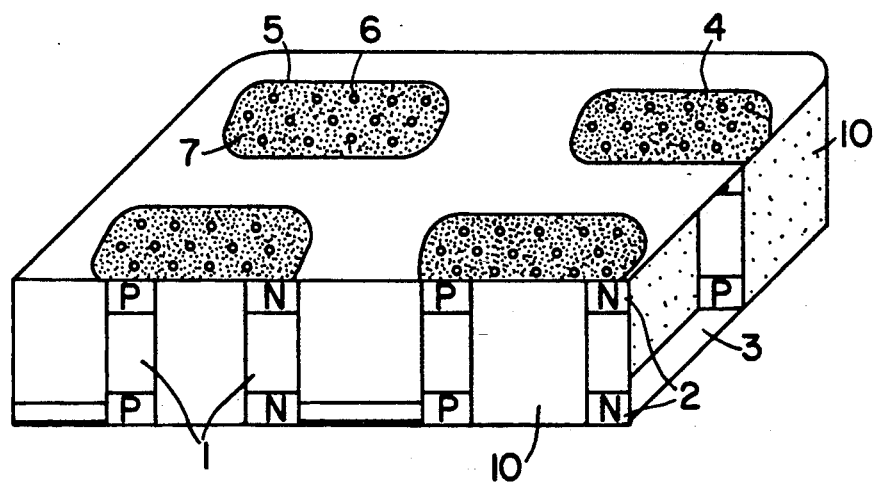
FIG. 2 is an isometric sketch of a fraction of the connections of composite semiconductive P and N type elements and P-N couples.
Figure 3:
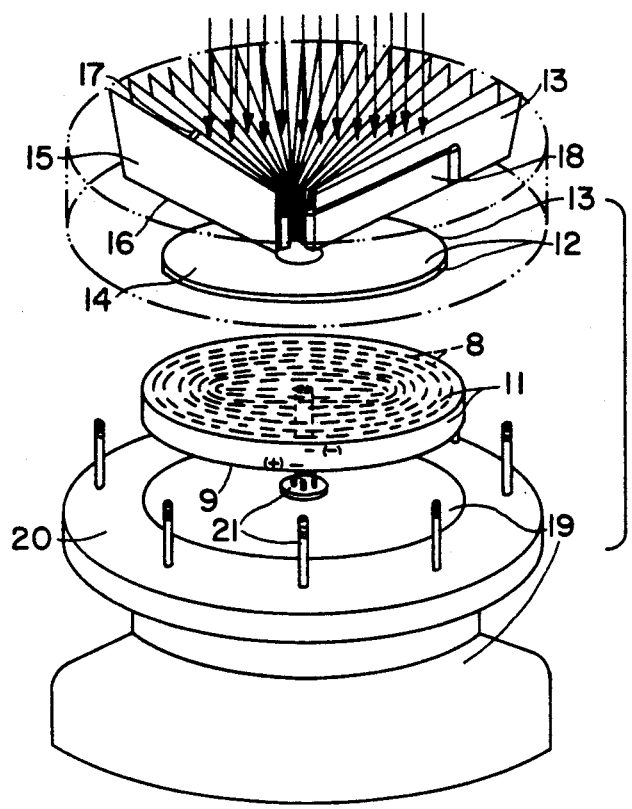
FIG. 3 shows an exploded isometric view of the structure of a model 1 thermoelectric refrigerating device consisting of composite semiconductive elements.
Figure 4:
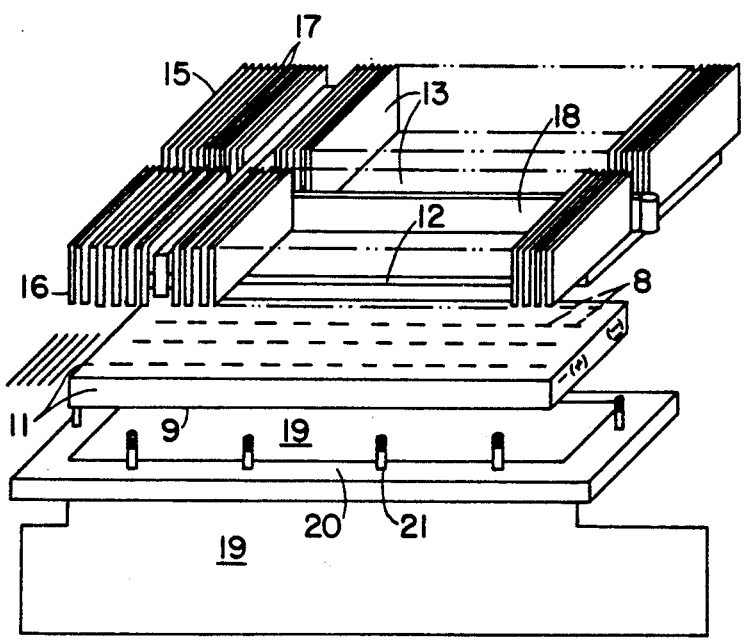
FIG. 4 shows an exploded isometric view of the structure of a model 2 composite semiconductive thermoelectric refrigerating device.

Turning now in detail to the drawings, conductive copper 1 is sandwiched between P or N type semiconductors 2 by surface brazing, so as to form composite P and N elements which may have a rectangular or circular cross-section. Lengths of the composite semiconductive P and N type elements may be as long as the adiabatic distance (II) requires. Pairs of composite semiconductor P and N type elements are connected by brazed off, flat copper strips 3 with semi-circular ends and rectangular middle sections, so as to form a P-N couple. Sufficient adiabatic distances (S) are left between composite semiconductive P and N elements and between P-N couples. The two ends of P-N couples are covered with flexible thermoconductive electrical insulating greased films 4, with an area slightly larger than that of the copper strips 3. The base film 5 is made of a thermoconductive electric insulator (e.g., an unsintered ceramic sheet, in which there are evenly distributed openings 6). Thermoconductive grease 7 is smeared on both faces of the film and filled into the openings thereof. More than a hundred or several hundreds of composite semiconductor P-N couples are connected in series in a required array fixed in position all around, except their hot and cold end surfaces by a thermal and electrical insulating material 10, e.g., polyamide foam, forming an air-tight and adiabatic composite semiconductive thermoelectric module 11.

The first embodiment of the invention has a circular form. The corresponding radiator base plate 12 and radiator 13 also have a circular configuration. The base plate 12 is composed of a single circular or two semi-circular or more than two fan-shaped copper plates which are from 2 mm to 4 mm thick. Fins 15, which are made of copper sheets from 0.1 mm to 0.5 mm thick, are attached to the base plate 12 by brazing their bent edges 16 onto the surface of the base plate, so as to form an integral air-cooled metallic radiator. Radially arranged fins have an included angle 17 of 1 to 5 degrees. Smaller angles are required for refrigerating devices used for lower temperatures to increase the number of fins. This means that the total radiation area is increased while maintaining the size of the fins. Larger included angles are applied to devices for higher temperatures to save fins. A clamping bar 18 is spaced between every 10 to 20 fins. To conform to the shape of the composite semiconductive thermoelectric module, which is circular, the corresponding heat absorber 19 is also circular. Heat absorber 19 is set in a plastic connecting flange 20, which is provided with bolts 21 for holding together the thermoelastic module with the thermal radiator and the heat absorber. The bolts pass through the openings at the ends of the clamping bars and hold the inner surface of the radiator and the outer surface of the heat absorber in contact, respectively, with the hot and cold end surfaces of the thermoelectric device by tightening them up with nuts to a given pressure. The composite semiconductive thermoelectric refrigerating device of the first embodiment is now complete. The radiators of the refrigerating devices of this embodiment are equipped with axial fans.

The second embodiment of the invention is rectangular. The corresponding radiator base plate 12 and the complete radiator 13 are also rectangular. The radiator base plate is a single copper plate, which is 2 mm to 4 mm thick or which is composed of several copper plates. Fins 15 made of copper sheet 0.1 mm to 0.5 mm thick are secured to the surface of the radiator base plate by brazing their bent edges 16 onto the base plate with the aid of a fixture, thereby composing an integral air-cooled radiator. The spacing 17 between the parallel arranged fins, depending on the embodiment of the invention, is from 1 mm to 4 mm thick. A clamping bar 18 is placed in the remaining space between every 20 to 30 fins. To conform to the shape of the composite semiconductive thermoelectric module, the corresponding heat absorber 19 is also rectangular. A heat absorber is inlaid in a frame 20, which is made of plastic with bolts 21.

The composite of the second embodiment is constructed by joining the inner surface of a thermal radiator, which consists of one integral or several parts, and the outer surface of a heat absorber, respectively, with the hot and cold end surfaces of said thermoelectric module by bolts 21. The bolts pass through the openings at the ends of the clamping bars 18 and are secured by nuts. Units of the second embodiment of the invention are equipped with or without a fan.

In addition to the foregoing embodiments, additional embodiments of the invention can be constructed with the composite semiconductive thermoelectric modules of different shapes.

When direct current is turned on in one of the composite semiconductor thermoelectric refrigerating embodiments of the invention, the end surface of cold absorbed the heat from the object to be cooled through an absorber. The end surface of hot gives out the heat to outside through a radiator. The good conductor in the middle functions as the "heat transferring heat capacitor."

Because all of the dozens or hundreds of composite semiconductor P-N couples connected in series are adiabatically sealed all around, with the exception of their end surfaces, temperature differences exist only between their end surfaces, and there is no heat exchange on the rest of the surfaces. Consequently, an "electronic heat pump" refrigerating device working according to the following process is accomplished: The absorber absorbs the heat from an object to be cooled,→thermoconductive greased film,→cold junction of composite semiconductor thermocouple,→electronic current of loading heat,→transitional junction,→heat capacitor, heat transferring,→transitional junction,→electronic current of loading heat,→hot junction of composite semiconductive thermocouple,→thermoconductive grease film,→radiator→heat dissipated into the atmosphere by forced (use of a fan) or convective heat exchange.

Electric resistance of a composite semiconductor thermoelectric module changes with the temperature of the atmosphere being cooled. Hence, the electric resistance can be used as a feedback signal for the automatic control of the direct current in a refrigeration device. As a result of the current control, the rate of cooling and the equilibrium temperature can be controlled. Through the automatic control, said composite semiconductor thermoelectric refrigerating device can be kept in equilibrium at a given temperature. The realization of automatic control of said composite semiconductive thermoelectric refrigerating device of the invention can greatly improve efficient and conserve energy.

The invention provides a composite semiconductor thermoelectric refrigerating device with optimized construction. Refrigerators using the semiconductor thermoelectric module of the invention as heat sinks are characterized by high efficiency, compactness, reliability, ability to function in all positions, mobility, adaptability to different working conditions, low production cost and ease of automatic control. Refrigerators for specific use can also be built using the thermoelectric devices of the invention.

While several embodiments of the present invention have been shown and described, it is to be understood that many changes and modifications may be made thereunto, without departing from the spirit and scope of the invention as defined in the appended claims.

What is claimed is:

1. A composite semiconductor thermoelectric element for use in a thermoelectric module assembly for transfering heat between a hot and a cold junction, said element comprising two semiconductor layers of like type, each said layer having inner and outer surfaces and having interposed between said inner surfaces a good thermoconductive and electroconductive member, said member being joined to the two semiconductor layers by surface to surface brazing, said outer surfaces each to be connected to an electrical conductor.

2. A composite thermoelectric element as claimed in claim 1, wherein said outer surfaces are brazed to strips of said electrical conductor and further comprising a flexible thermoconductive electrical insulating greased film having two sides, the film to be interposed between said strips and a respective one of said junctions, said greased film being greased on at least one side with a thermoconductive grease.

3. A composite semiconductor thermoelectric element for use in a thermoelectric module assembly for transferring heat between a hot and a cold junction, said element comprising two semiconductor layers of like type, each of said layers having inner and outer surfaces and having interposed between said inner surfaces a good thermoconductive and electroconductive member, said member being joined to the two semiconductor layers by surface to surface brazing, said outer surfaces each to be connected to an electrical conductor;

wherein said outer surfaces are brazed to strips of said electrical conductor;

a flexible thermoconductive electrical insulating greased film having two sides, the film to be interposed between said strips and a respective one of said junctions; and wherein said greased film is evenly greased on both sides of said film, with a thermoconductive grease.

4. A composite thermoelectric element as claimed in claim 3, wherein said greased film is provided with evenly distributed openings filled up with said grease.

5. A thermoelectric module refrigerating assembly comprising a plurality of composite semiconductor thermoelectric elements connected in series electrically and in parallel thermally for transferring heat between a hot and a cold junction, said composite elements each comprising two semiconductor layers each of like type having inner and outer surfaces, and having interposed between said inner surfaces a good thermoconductive and electroconductive member, said member being joined to the two semiconductor layers by surface to surface brazing, said outer surfaces each being brazed to strips of an electrical conductor, said strips being connected electrically in series.

6. An assembly as claimed in claim 5, further comprising a flexible thermoconductive electrical insulating greased film having two sides, the film to be interposed between said strips and a respective one of said junctions, said greased film being greased on at least one side with a thermoconductive grease.

7. A thermoelectric module refrigerating assembly comprising a plurality of composite semiconductor thermoelectric elements connected in series electrically and in parallel thermally for transferring heat between a hot and a cold junction, said composite elements each comprising two semiconductor layers, each of like type having inner and outer surfaces, and having interposed between said inner surfaces a good thermoconductive and electroconductive member, said member being joined to the two semiconductor layers by surface to surface brazing, said outer surfaces each being brazed to strips of an electrical conductor, said strips being connected electrically in series;

a flexible thermoconductive electrical insulating greased film having two sides, the film to be interposed between said strips and a respective one of said junctions; and wherein said greased film is evenly greased on both sides of said film, with a thermoconductive grease.

8. An assembly as claimed in claim 7, wherein said greased film is provided at both said hot and cold junction.

9. An assembly as claimed in claim 8, wherein said greased film is sized to cover only said strips.

10. An assembly as claimed in claim 7, wherein said greased film is provided with evenly distributed openings filled up with said grease.

11. An assembly as claimed in claim 9, wherein said greased film is provided with evenly distributed openings filled up with said grease.

12. An assembly as claimed in, claim 7, wherein said composite elements are fixed and isolated from ambient air by thermal and electrical insulation.

13. An assembly as claimed in claim 10, wherein said composite elements are fixed and isolated from ambient air by thermal and electrical insulation.

14. An assembly as claimed in claim 7, wherein the hot junction comprises a base plate for a radiator 15. An assembly as claimed in claim 14, wherein the base plate is made of copper, is 2 to 4 mm thick and is provided with fins made of copper sheets 0.1 to 0.5 mm thick, each having bent edges brazed onto a surface of the base plate and being longer than the base plate, forming an air cooled metallic radiator.

16. A thermoelectric module refrigerating assembly comprising:

a plurality of semiconductor thermoelectric elements connected in series electrically and in parallel thermally for transferring heat between a hot and a cold junction, outer surfaces of each said element being connected to an electrical conductor, said conductors being connected electrically in series;

a flexible thermoconductive electrical insulating greased film having two sides, the film to be interposed between said strips and a respective one of said junctions; and wherein said greased film is evenly greased on both sides of said film, with a thermoconductive grease.

17. An assembly as claimed in claim 16, wherein said greased film is provided at both said hot and cold junction.

18. An assembly as claimed in claim 17, wherein said greased film is sized to cover only said strips.

19. An assembly as claimed in claim 16, wherein said greased film is provided with evenly distributed openings filled up with said grease.

20. An assembly as claimed in claim 18, wherein said greased film is provided with evenly distributed openings filled up with said grease.

21. An assembly as claimed in claim 16, wherein said composite elements are fixed and isolated from ambient air by thermal and electrical insulation.

22. An assembly as claimed in claim 16, wherein the hot junction comprises a base plate for a radiator.

23. An assembly as claimed in claim 22, wherein the base plate is made of copper, is 2 to 4 mm thick and is provided with fins made of copper sheets 0.1 to 0.5 mm thick, each having bent edges brazed onto a surface of the base plate and being longer than the base plate, forming an air cooled metallic radiator.

24. A P and N type of thermoelectric element formed by a composite material, comprising:

a good conductor interposed between two semiconductive materials of like type by end section to end section brazing to form a composite semiconductive thermoelectric element which has a configuration of P type semiconductor + a good conductor + P type semiconductor as the composite element of P type;

a composite element of the N type which has same configuration as the composite element of the P type, except that an N type semiconductor is substituted for the P type semiconductor; and two of these composite elements form a thermocouple, comprising a composite semiconductive thermocouple.

25. The P and N type of thermoelectric element according to claim 24, wherein each composite semiconductive thermoelectric element has 4 junctions, in two sectional ends;

the outer surfaces of the semiconductors forming two junctions with copper plates while the inner surfaces of semiconductors forming two other transitional junctions with a good conductor.

26. The P and N type of thermoelectric element according to claim 24,
   further comprising insulation of a thickness based upon the temperature difference between the hot end and the cold end of each composite semiconductive thermoelectric element.

27. The P and N type thermoelectric element according to claim 26,
   wherein the composite element forms the composite thermocouple and then forms the composite module; and
   the thermal and electrical insulative material being sandwiched between the composite elements inside of said composite module.

28. The P and N type of thermoelectric element according to claim 24,
   wherein the semiconductor of composite semiconductive thermoelectric module has a certain resistance value during the working time, and said resistant value being a self-control feedback signal, 29. The P and N type of thermoelectric element according to claim 27,
   wherein the shape of appearance of a composite semiconductive thermoelectric module will depend on practical cooling requirements.

30. The P and N type of thermoelectric element according to claim 29,
   wherein the shape is a radiator shape which is dependent on the shape of composite semiconductor thermoelectric module;
   the radiator is metallic formed through a module by fins having bent edges brazed onto a surface of a base plate, to produce an integral air cooled metallic radiator.

31. The P and N type of thermoelectric element according to claim 30,
   wherein the radiator is circular shaped; and
   wherein the fins are arranged radiative and having the angle of 1 degree to 5 degree when the radiator is the circular shaped.

32. The P and N type of thermoelectric element according to claim 30,
   wherein the radiator is square shaped; and
   wherein the fins are arranged parallel and having the distance from 1 mm to 4 mm between each other when the radiator is square shaped.

* * * * *